(12) United States Patent
Matsui et al.

(10) Patent No.: US 6,885,426 B2
(45) Date of Patent: Apr. 26, 2005

(54) LIQUID CRYSTAL DISPLAY DEVICE AND THE MANUFACTURING METHOD THEREOF WITH AN ANISOTROPIC CONDUCTIVE ADHESIVE

(75) Inventors: Takashi Matsui, Nara (JP); Motoji Shiota, Nara (JP); Kiyoshi Inada, Joyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 45 days.

(21) Appl. No.: 10/376,335

(22) Filed: Mar. 3, 2003

(65) Prior Publication Data

US 2003/0174273 A1 Sep. 18, 2003

(30) Foreign Application Priority Data

Mar. 13, 2002 (JP) .......................... 2002-069259
Nov. 25, 2002 (JP) .......................... 2002-341562

(51) Int. Cl.[7] .............................................. G02F 1/13
(52) U.S. Cl. ..................................................... 349/187
(58) Field of Search ........................ 349/187; 257/30; 438/30; 345/89; 174/256

(56) References Cited

U.S. PATENT DOCUMENTS

| | | | |
|---|---|---|---|
| 4,948,690 A | * | 8/1990 | Hisamura et al. ............. 430/60 |
| 5,208,883 A | * | 5/1993 | Hattori et al. ................. 385/43 |
| 6,309,502 B1 | * | 10/2001 | Hiroshige et al. ........ 156/273.3 |
| 6,671,024 B1 | * | 12/2003 | Uchiyama .................... 349/152 |
| 2001/0046021 A1 | * | 11/2001 | Kozuka et al. .............. 349/150 |
| 2004/0026363 A1 | * | 2/2004 | Akamatsu et al. ............. 216/13 |

FOREIGN PATENT DOCUMENTS

| | | | |
|---|---|---|---|
| JP | 10-206874 A | 8/1998 | |
| JP | 11048128 | * 2/1999 | ........... B24B/37/00 |
| JP | 2000-150580 A | 5/2000 | |

OTHER PUBLICATIONS

NB 9112341 IBM Technical disclosure Bulletin, Dec. 1991, US vol. 34, 7B, PP 341–342.*

* cited by examiner

Primary Examiner—Tarifur R. Chowdhury
Assistant Examiner—P. R. Akkapeddi
(74) Attorney, Agent, or Firm—Birch, Stewart, Kolasch & Birch, LLP (57) ABSTRACT

In the manufacturing step of performing thermal compression bonding with respect to a driving integrated circuit and a glass substrate included in a liquid crystal panel so as to connect an electrode of the driving integrated circuit and an electrode of the glass substrate by using an anisotropic conductive adhesive in which conductive particles are diffused in an insulative adhesive, the anisotropic conductive adhesive includes conductive particles, a resin a whose average molecular weight is in a range of from 10000 to 100000, a resin b whose average molecular weight is of not more than 1000, a stress relaxation resin, and a curing agent; and a Young's modulus of the anisotropic conductive adhesive after curing is in a range of from 1.4 Gpa to 1.6 Gpa.

13 Claims, 7 Drawing Sheets

LIQUID CRYSTAL DISPLAY DEVICE AND THE MANUFACTURING METHOD THEREOF WITH AN ANISOTROPIC CONDUCTIVE ADHESIVE

FIELD OF THE INVENTION

The present invention relates to a liquid crystal display device in which a driving integrated circuit is bonded to a glass substrate of the liquid crystal panel, and the manufacturing method of the liquid crystal display device.

BACKGROUND OF THE INVENTION

A liquid crystal display device used for a display screen of a mobile phone or a personal computer etc. is created by mounting a driving IC (liquid crystal driving IC) to a liquid crystal panel, which includes a liquid crystal layer sealed between a pair of substrates.

Incidentally, a TCP (Tape Carrier Package) method is used in general for mounting a driving IC with respect to a liquid crystal panel.

Further, in recent years, a COG (Chip On Glass) method of performing bear chip mounting of the driving IC to the liquid crystal panel is becoming more common in terms of cost reduction, improvement of reliability, realizing a thinner display etc. In this kind of method, the most common method is a method of carrying out face down bonding so as to connect an umbonal bump electrode, which is formed on the driving IC, to a pad (electric wiring) of the liquid crystal panel.

Note that, the pad is electrical wiring formed on a driving IC connection area of the display substrate (glass substrate) in the liquid crystal panel. Further, the pad includes signal wiring extended to the display section of the liquid crystal panel, and supplies a data signal and a scanning signal to the display section, an output bonding pad short-circuited to the signal wiring, supply wiring (input wiring) for supplying a signal and electric power (electric power source) to the driving IC, an input bonding pad short-circuited to the supply wiring, and an FPC input terminal for transmitting a signal and electric power supplied from an external circuit to the supply wiring. Note that, the FPC input terminal is short-circuited to the supply wiring and has a function of connecting to an FPC (Flexible Printed Circuit) for carrying out wire connection with an external circuit.

Further, as to the COG connection method, known is such as a method of forming a bump electrode of the driving IC by using a solder, and fusing the electrode into the pad of a liquid crystal panel so as to connect the electrode to the pad, or a method of forming a bump electrode by using a metal such as Au, and connecting the electrode to the pad by an anisotropic conductive adhesive. Here, the anisotropic conductive adhesive (AC adhesive) is an adhesive made of conductive paste or an insulative adhesive, which is mixed with conductive particles diffused therein. In the COG method, the one made of an insulative adhesive is adopted.

Particularly, in a connection method using the AC adhesive, the conduction between the driving IC and the liquid crystal panel is carried out by holding the conductive particles included in the adhesive between a bump electrode of the driving IC and a pad of the liquid crystal panel. In this manner, the connection pitch only depends on the size of the bump electrode. Further, the insulation property between each electrode can easily be improved by filling the insulative adhesive between the electrodes. In view of these advantages, the connection method using the AC adhesive is a mainstream in the COG method.

Figure 2:
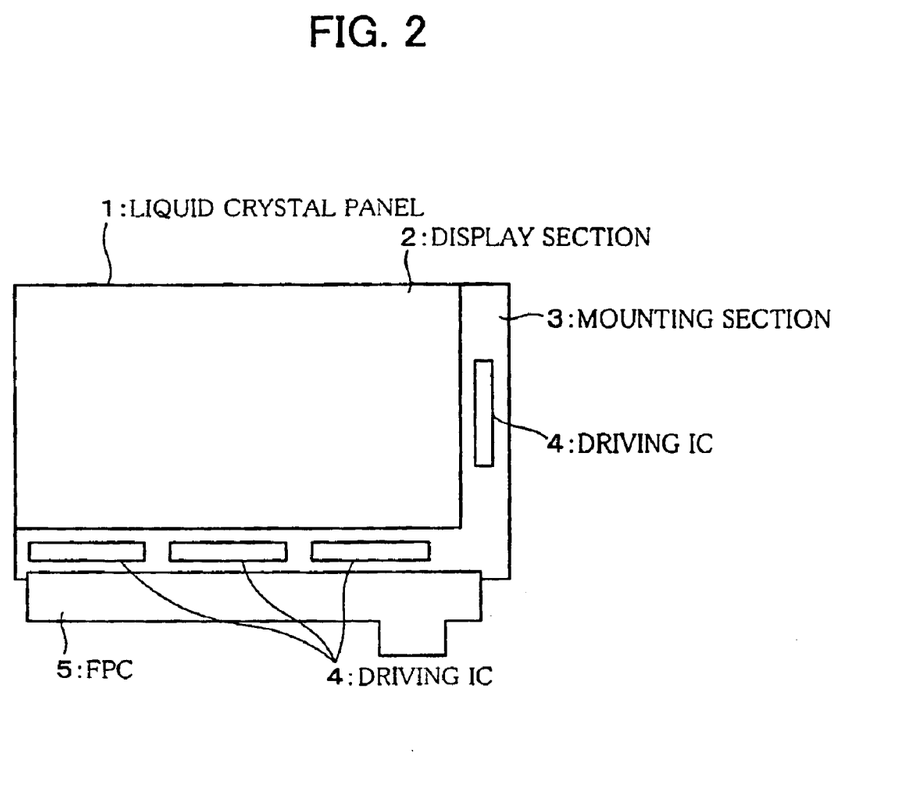
FIG. 2 is a plan view schematically showing a configuration of a conventional liquid crystal display device, and also of a liquid crystal display device according to the present invention.
Figure 3:
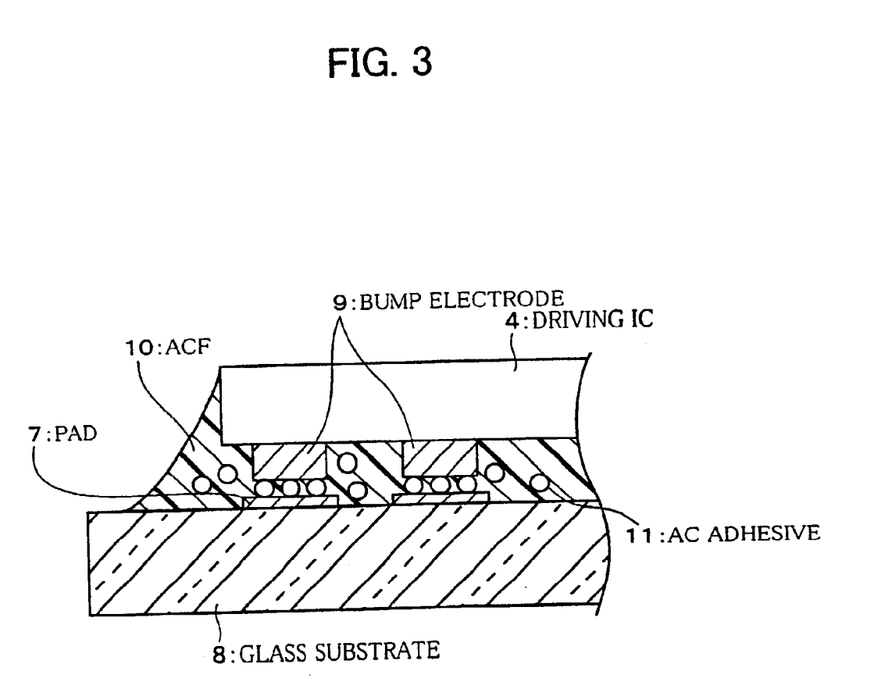
FIG. 3 is a cross-sectional view showing a main part of a configuration of a conventional liquid crystal display device.
Figure 4:
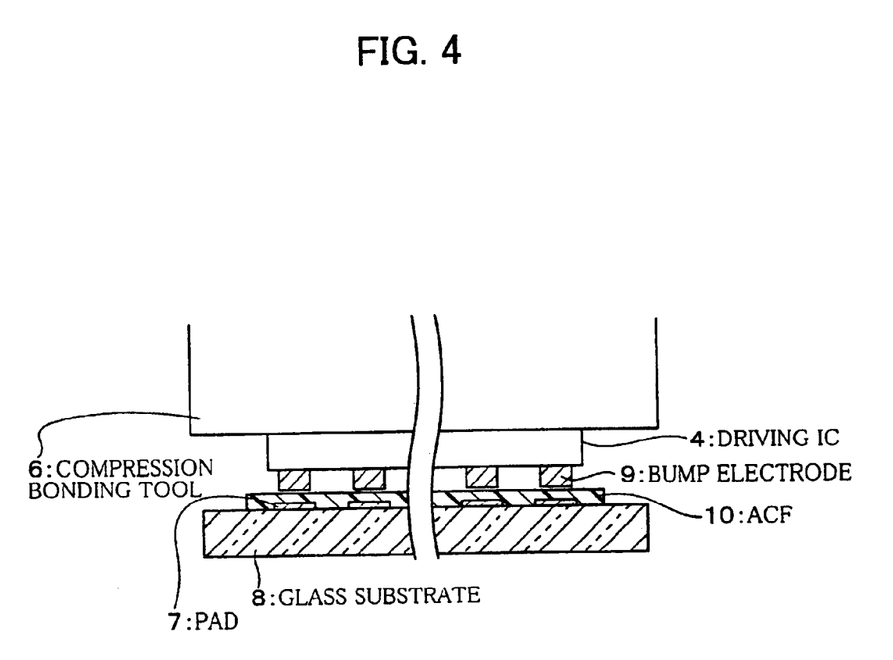
FIG. 4 is an explanatory view showing a manufacturing method of a conventional liquid crystal display device, and also of a liquid crystal display device according to the present invention.

The following will explain connection operation (face down bonding) of a liquid crystal panel and a driving IC in case of using an anisotoropic conductive film (ACF) as the AC adhesive, with reference to FIGS. 2 through 4 according to the present invention.

For ease of explanation, materials having the equivalent functions as those of the present invention will be given the same reference symbols. Further, the ACF is an AC adhesive including conductive particles diffused in an adhesion film, which has the thickness of 15 $\mu$m to 45 $\mu$m.

FIG. 2 is a plan view schematically showing an arrangement of a liquid crystal display device. As shown in the figure, the liquid crystal display device includes a driving IC 4 and a liquid crystal panel 1.

Further, FIG. 3 is a cross-sectional view showing a connection portion for connecting the driving IC 4 and the liquid crystal panel 1. As shown in the figure, the driving IC is bonded with respect to a glass substrate 8 of the liquid crystal panel 1 through an ACF 10. Further, the conductive particles 11 diffused in an adhesion film of the ACF 10 are caught between a bump electrode 9 of the driving IC 4 and a pad 7 provided on the glass substrate 8. The bump electrode 9 and the pad 7 are electrically conducted by the conductive particles 11.

Here, the following will explain a method of bonding the driving IC 4 and the glass substrate 8 through the ACF 10 with reference to FIG. 4.

Firstly, the ACF 10 is placed in an area (mounting section 3) including the pad 7 of the glass substrate 8. Then, the pad 7 and the bump electrode 9 of the driving IC 4 are adjusted to be set in the same position. Thereafter, the driving IC 4 is subjected to thermo compression bonding with respect to the glass substrate 8 by using a compression bonding tool 6.

Through this process, the ACF is hardened, and the driving IC 4 and the glass substrate 8 are bonded. Here, as it is described in Japanese Laid-Open Patent Application Tokukaihei 10-206874/1998 (published on Aug. 7, 1998), the conductive particles 11 are deformed due to its elasticity by being caught between the pad 7 and the bump electrode 9. Further, since the deformed conductive particles 11 are held by the surrounding insulative adhesive, the pad 7 and the bump electrode 9 are electrically conducted to each other.

Note that, the AC adhesive is not always a film-shaped but can be in a state of paint, as with the one disclosed in Japanese Laid-Open Patent Application Tokukai 2000-150580/2000 (published on May 30, 2000). This publication also discloses a technique for placing a glass substrate on a circular arc-shaped compression bonding stage when the driving IC is subjected to compression bonding with respect to the glass substrate. This technique is used for the purpose of maintenance of flatness of the glass substrate at the time of thermo compression bonding, by relying on the shape of the compression bonding stage.

Incidentally, in the bonding method shown in FIG. 4, the thermo compression bonding is performed by pressing the compression bonding tool 6 to the driving IC 4. Therefore, the temperature of the driving IC 4 becomes higher than that of the glass substrate 8, and this brings about great thermal expansion of the driving IC 4. As a result, the AC adhesive is hardened and shrunk by having the glass substrate 8 and the driving IC 4, which are different to each other in their thermal expansion level.

Figure 5:
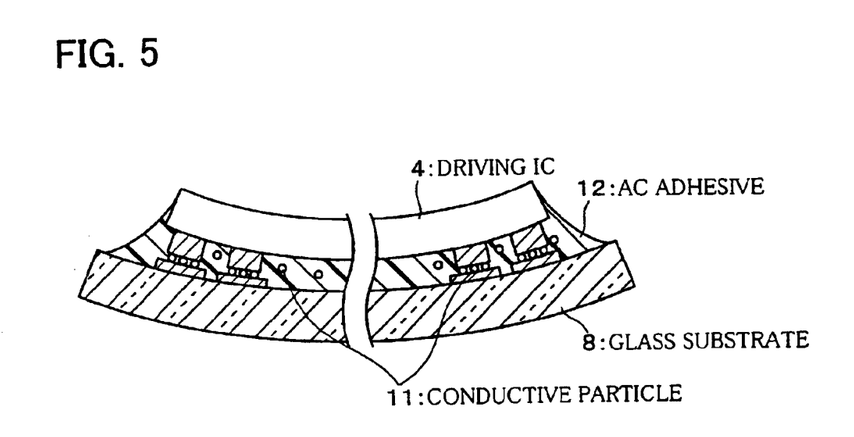
FIG. 5 is a drawing showing a bonding part of the driving IC and a glass substrate in which a bend is occurred at conventional thermo compression bonding due to difference of shrinkage level.

Consequently, after the thermo compression bonding, difference occurs between the glass substrate 8 and the driving IC 4 in their shrinkage levels. This causes a bend at the bonding portion between the driving IC 4 and the glass substrate 8, as shown in FIG. 5.

The bend affects further in the display section 2 of the liquid crystal panel 1, and brings about a problem of unevenness of luminance of displayed images.

Figure 6:
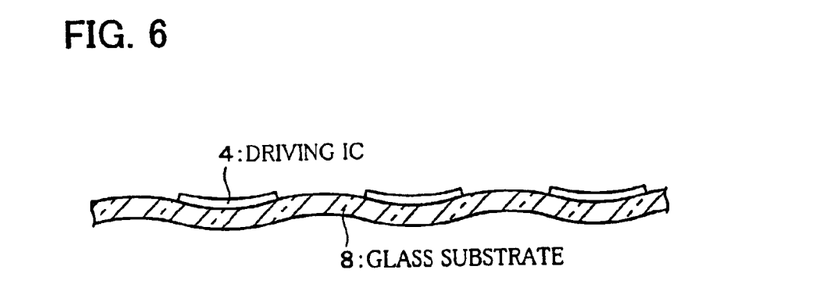
FIG. 6 is a drawing showing a bonding part of the driving IC and a glass substrate causing waveform deformation due to thermo compression bonding.

Further, in a larger liquid crystal display device, or a liquid crystal display device with higher definition, the device includes a plurality of driving ICs 4 bonded to the glass substrate 8. In such a liquid crystal display device, the described bend occurred at the bonding portion between the driving IC 4 and the glass substrate 8 may further cause waveform deformation of the glass substrate 8, as shown in FIG. 6.

SUMMARY OF THE INVENTION

The present invention is made in view of the foregoing conventional problems, and an object is to provide a method of manufacturing a liquid crystal display device free from unevenness of luminance at the display section and capable of high quality display, by preventing a bend occurred at the bonding part between the driving IC and the glass substrate. The present invention also provides a liquid crystal display device manufactured through the method.

In order to solve the foregoing problems, a manufacturing method of a liquid crystal display device, includes the step of: performing thermo compression bonding with respect to a driving integrated circuit and a glass substrate included in a liquid crystal panel so as to connect an electrode of the driving integrated circuit and an electrode of the glass substrate, by using an anisotropic conductive adhesive in which conductive particles are diffused in an insulative adhesive, wherein: the anisotropic conductive adhesive includes a resin a whose average molecular weight is in a range of from 10000 to 100000, a resin b whose average molecular weight is of not more than 1000, a stress relaxation resin, and a curing agent; and a Young's modulus of the anisotropic conductive adhesive after curing is in a range of from 1.4 Gpa to 1.6 Gpa.

This manufacturing method includes the step of connecting an electrode (bump electrode) of a driving integrated circuit (driving IC) and an electrode (pad) of a liquid crystal panel, through a COG (Chip On Glass) method using an anisotropic conductive adhesive (AC adhesive).

The step carries out thermo compression bonding with respect to the driving IC and the liquid crystal panel so that the driving IC and the liquid crystal panel are bonded when the AC adhesive applied (or placed) between them is hardened. Further, the bump electrode of the driving IC and the pad of the liquid crystal panel is electrically connected through conductive particles which is included in the AC adhesive, and deformed by being caught between the driving IC and the liquid crystal panel.

Further, particularly, in the manufacturing method of the present invention, the AC adhesive includes: a resin a whose average molecular weight is in a range of from 10000 to 100000 and a resin b whose average molecular weight is of not more than 1000, in addition to the conductive particles, a stress relaxation resin, and a curing agent.

As described, the manufacturing method of a liquid crystal display device of the present invention uses an AC adhesive of which Young's modulus after curing is 1.4 Gpa to 1.6 Gpa, i.e., the AC adhesive relatively easy to be deformed. On this account, when one of the driving IC and the liquid crystal panel is greatly shrunk after subjected to thermo compression bonding, the AC adhesive can be deformed according to the shrinkage. Thus, it is possible to prevent such an influence of shrinkage that shrinkage of one of the driving IC and the liquid crystal panel affects the shape of the other.

Consequently, even when, for example, the driving IC is greatly shrunk, it is possible to prevent a bent on the glass substrate of the liquid crystal panel. On this account, the manufacturing method of the present invention can provide a liquid crystal display device free from unevenness of luminance at the display section of the liquid crystal panel, and capable of high quality display.

Further, the anisotropic conductive adhesive of the present invention includes: conductive particles; a resin a whose average molecular weight is in a range of from 10000 to 100000; a resin b whose average molecular weight is of not more than 1000; a stress relaxation resin; and a curing agent, wherein: a Young's modulus of the anisotropic conductive adhesive after curing is in a range of from 1.4 Gpa to 1.6 Gpa.

The anisotropic conductive adhesive of the present invention is used in the descried manufacturing method of the present invention. Accordingly, by using the anisotropic conductive adhesive of the present invention, it is possible to create a liquid crystal display device free from unevenness of luminance at the display section of the liquid crystal panel, and capable of high quality display.

Additional objects, features, and strengths of the present invention will be made clear by the description below. Further, the advantages of the present invention will be evident from the following explanation in reference to the drawings.

DESCRIPTION OF THE EMBODIMENTS

[First Embodiment]

Figure 1:
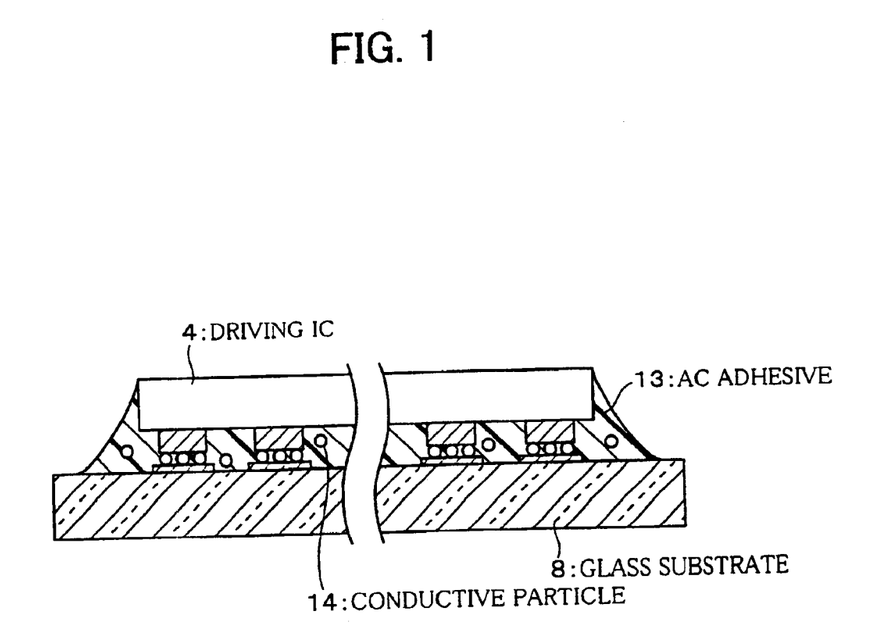
FIG. 1 is a cross-sectional view showing a main part of a configuration of a liquid crystal display device according to the present invention.

The following will explain one embodiment of the present invention with reference to FIGS. 1, 2 and 4.

A liquid crystal display device according to the present invention is manufactured by a COG (Chip On Glass) method in which a driving IC is mounted on a liquid crystal display panel (liquid crystal panel) in the form of bear chip (bear chip mounting). Further, the liquid crystal display device has such a configuration that the driving IC thereon includes an umbonal bump electrode (bump electrode for bonding), which is connected to a pad (bonding pad; electric wiring) of the liquid crystal panel through face down bonding.

FIG. 2 is a plan view schematically showing a configuration of the liquid crystal display device of the present invention. As shown in the figure, the liquid crystal display device includes a liquid crystal panel 1, a liquid crystal driving IC (driving IC) 4, and a flexible printed circuit (FPC) 5.

The liquid crystal panel 1 is constituted by a pair of glass substrates 8 having a liquid crystal layer (not shown) sealed therebetween, and the panel includes a display section 2 and a mounting section 3. The display section 2 is a display screen of the liquid crystal display device.

Further, the mounting section 3 is a mounting area for the driving IC4, and includes electric wiring (pad) for driving the liquid crystal panel 1.

The driving IC 4 is an integrated circuit for driving a liquid crystal layer of the liquid crystal panel 1, and is mounted in the mounting section 3 of the liquid crystal panel 1. Further, the driving IC 4 includes an umbonal bump electrode to be connected to the pad of the mounting section 3.

The FPC 5 operates to input a data signal and a scanning signal, which are externally supplied, to the driving IC 4.

FIG. 1 is a cross-sectional view showing a main part of a configuration of a liquid crystal display device of the present invention, more specifically, a cross-sectional view showing a connection portion of the driving IC 4 and the glass substrate 8.

As shown in the figure, a bump electrode 9 is formed by using Au on the driving IC 4. Further, in the mounting section 3 of the liquid crystal panel 1, the pad 7 is formed on the glass substrate 8. Further, the driving IC 4 and the glass substrate 8 are bonded in the mounting section 3 by using an anisotropic conductive adhesive (AC adhesive 13) while oppositely placing the bump electrode 9 and the pad 7.

The AC adhesive 13 is made of conductive particles 14, which are diffused in an insulative adhesive so as to be mixed with the adhesive. The electrical conduction between the bump electrode 9 and the pad 7 is realized by holding the conductive particles 14 between a bump electrode 9 of the driving IC 4 and a pad 7 of the glass substrate 8. Note that, the AC adhesive 13 will be explained later in detail.

Here, the following will explain a manufacturing method of the liquid crystal display device of the present invention with reference to FIG. 4.

The liquid crystal display device of the present invention is realized by bonding the driving IC 4 and the glass substrate 8 by using the AC adhesive 13. In this manner, the AC adhesive is applied on the pad 7 of the glass substrate 8, and then the bump electrode 9 of the driving IC 4 is brought to be placed on the pad 7 coated with the AC adhesive 13.

Thereafter, thermo compression bonding (this thermo compression bonding has a condition that; temperature: 170° C. to 190° C., welding pressure: 70 MPa to 90 Mpa, pressure applying time: 8 to 12 seconds) is carried out with respect to upper surface of the driving IC 4 by a compression bonding tool 6. With this process, the AC adhesive 13 is hardened (cured by heat), and the driving IC 4 and the glass substrate 8 are bonded.

Here, the conductive particles 14 are deformed (flattened) due to its elasticity, as they are caught between the pad 7 and the bump electrode 9. Therefore, in the liquid crystal display device of the present invention, since the conductive particles 14 are deformed by being caught between the pad 7 and the bump electrode 9, a larger connection area (contact area) is provided between the conductive particles 14 and the pad 7/bump electrode 9, thus reducing connection resistance.

Further, since the deformed conductive particles 14 are held by the surrounding AC adhesive 13 (insulative adhesive), stable electrical conduction can be realized between the pad 7 and the bump electrode 9.

Next, the following will explain the AC adhesive 13.

In addition to the described conductive particles 14, the AC adhesive 13 further includes an epoxy resin a (a resin a whose average molecular weight is in a range of 10000 to 100000), an epoxy resin b (a resin b whose average molecular weight is of not more than 1000), a stress relaxation resin made up of particles of an acrylic resin or a silicone resin having a diameter of not more than 1 μm, and a curing agent.

Note that, the acrylic resin above is a resin mainly including an acrylic acid, a methacrylic acid and/or derivatives of these resins, as its parent organization. Further, the silicone resin above is a resin made up of, as its parent organization, high molecules including an organic group such as an alkyl group or an aryl group, among various high molecules of an iteration structure (Si—O) of siloxane bond in which a silicon atom and an oxygen atom are bonded.

Since the AC adhesive 13 includes those components thus described above, its Young's modulus after curing is 1.4 Gpa to 1.6 Gpa, and its glass-transition temperature is 110° C. to 120° C.

Further, since the AC adhesive has such a Young's modulus, the strength of the AD adhesive for holding the conductive particles 14 caught between the pad 7 and the bump electrode 9 is a little weak. Thus, when the AC adhesive 13 includes conventional hard conductive particles, repulsive force of the deformed particles gets better of pressing force to deform the particles, and the particles cannot keep the deformed state; therefore, a desired contact area cannot be obtained. Accordingly, it is preferable to use soft conductive particles with small repulsive force.

In this regard, the liquid crystal display device of the present invention uses relatively soft particles having a diameter of 3 μm so as to be used as the conductive particles 14 in the AC adhesive 13. This particle included in the AC adhesive 13 is made of a plastic ball plated with nickel and further plated with gold thereon. The pressure (kgf/mm²) required for reducing the diameter of this conductive particle 14 by 10% is 350 kgf/mm² to 600 kgf/mm².

Here, the pressure (10% reduction pressure; K) required for reducing the diameter of the conductive particle 14 by 10% is a value defined by the following equations 1 and 2, according to "Dansei-Riron (Elasticity Theory)" (Tokyotosho. Inc.).

$$F = (2^{1/2}/3)(S^{3/2})(ER^{1/2})/(1-\sigma^2) \tag{Equation 1}$$

$$K = E/(1-\sigma^2) = (3/2^{1/2})(F)(S^{-3/2})(R^{-1/2}) \tag{Equation 2}$$

(In the equations, F denotes a load (kgf) for reducing the diameter of the conductive particle by 10%, S denotes mutation (mm) of the conductive particle when its diameter is reduced by 10%, R denotes the radius (mm) of the sphere of the conductive particle, and σ denotes Poisson's ratio of the conductive particle.)

As described, in the manufacturing method of a liquid crystal display device according to the present invention, the bonding of the driving IC 4 (bump electrode 9) and the glass substrate 8 (pad 7) is performed by using an AC adhesive whose Young's modulus after curing is in a range of 1.4 Gpa to 1.6 Gpa and including conductive particles 14, an epoxy resin a whose average molecular weight is in a range of 10000 to 100000, an epoxy resin b whose average molecular weight is of not more than 1000, a stress relaxation resin, and a curing agent.

Since the manufacturing method of a liquid crystal display device of the present invention uses an AC adhesive 13 of which Young's modulus after curing is 1.4 Gpa to 1.6 Gpa, i.e., the AC adhesive relatively easy to be deformed, when one of the driving IC 4 and the liquid crystal panel 1 is greatly shrunk after subjected to thermo compression bonding, the AC adhesive 13 can be deformed according to the shrinkage.

Thus, it is possible to prevent such an influence of shrinkage that shrinkage of one of the driving IC and the liquid crystal panel affects the shape of the other.

Consequently, even when, for example, the driving IC 4 is greatly shrunk, it is possible to prevent a bent on the glass substrate 8 of the liquid crystal panel 1. On this account, the present invention can provide a liquid crystal display device free from unevenness of luminance at the display section 2 of the liquid crystal panel 1, and capable of high quality display.

Further, the AC adhesive 13 includes a resin a and a resin b, which both are made of an epoxy resin. By thus including an epoxy resin having heat-resistant property, it is possible to prevent degradation of the AD adhesive 13 at the thermo compression bonding.

Further, the stress relaxation resin is made of particles of an acrylic resin or a silicone resin having a diameter of not more than 1 μm. Due to the components included in the acrylic resin or the silicone resin, when one of the driving IC 4 and the liquid crystal panel 1 is greatly shrunk after thermo compression bonding, the AC adhesive 13 is more easily able to deformed according to the shrinkage. Thus, it is possible to securely prevent such an influence of shrinkage that shrinkage of one of the driving IC and the liquid crystal panel affects the shape of the other.

Here, the following will explain an experiment for verifying a preferable range of the diameter of the conductive particles 14 included in the AC adhesive 13. In this experiment, plural kinds of conductive particles in a range of 350 kgf/mm² to 650 kgf/mm² for its 10% reduction pressure were created, and further, a plurality of AC adhesives were created by using these particles (components other than the conductive particles were the same as those of the AC adhesive 13).

Figure 7:
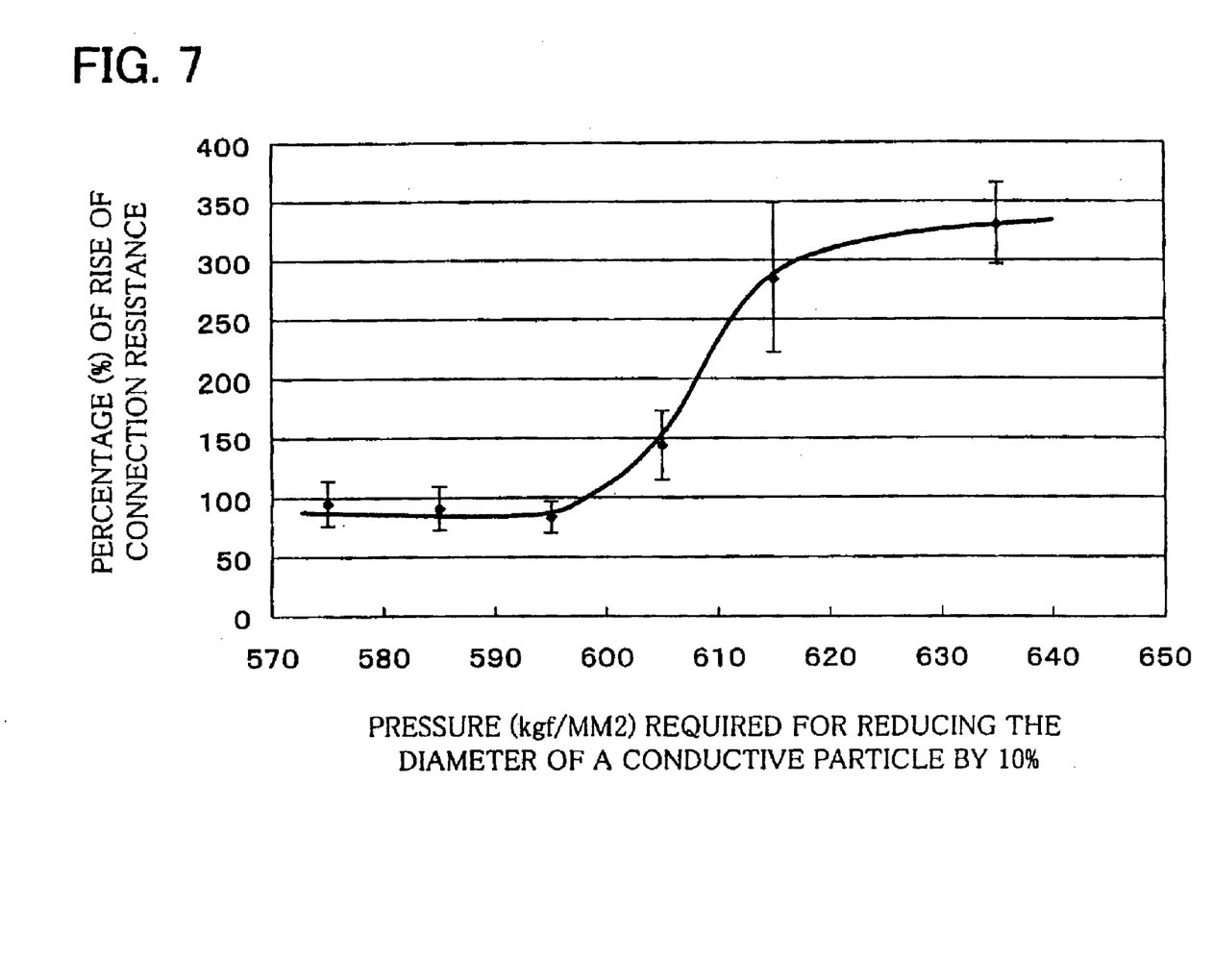
FIG. 7 is a part of a graph shown in FIG. 8 showing variation of percentage (%) of rise of resistance, with respect to variation of pressure (kgf/mm$^2$) required for reducing the diameter of a conductive particle by 10%, in one embodiment of the present invention.
Figure 8:
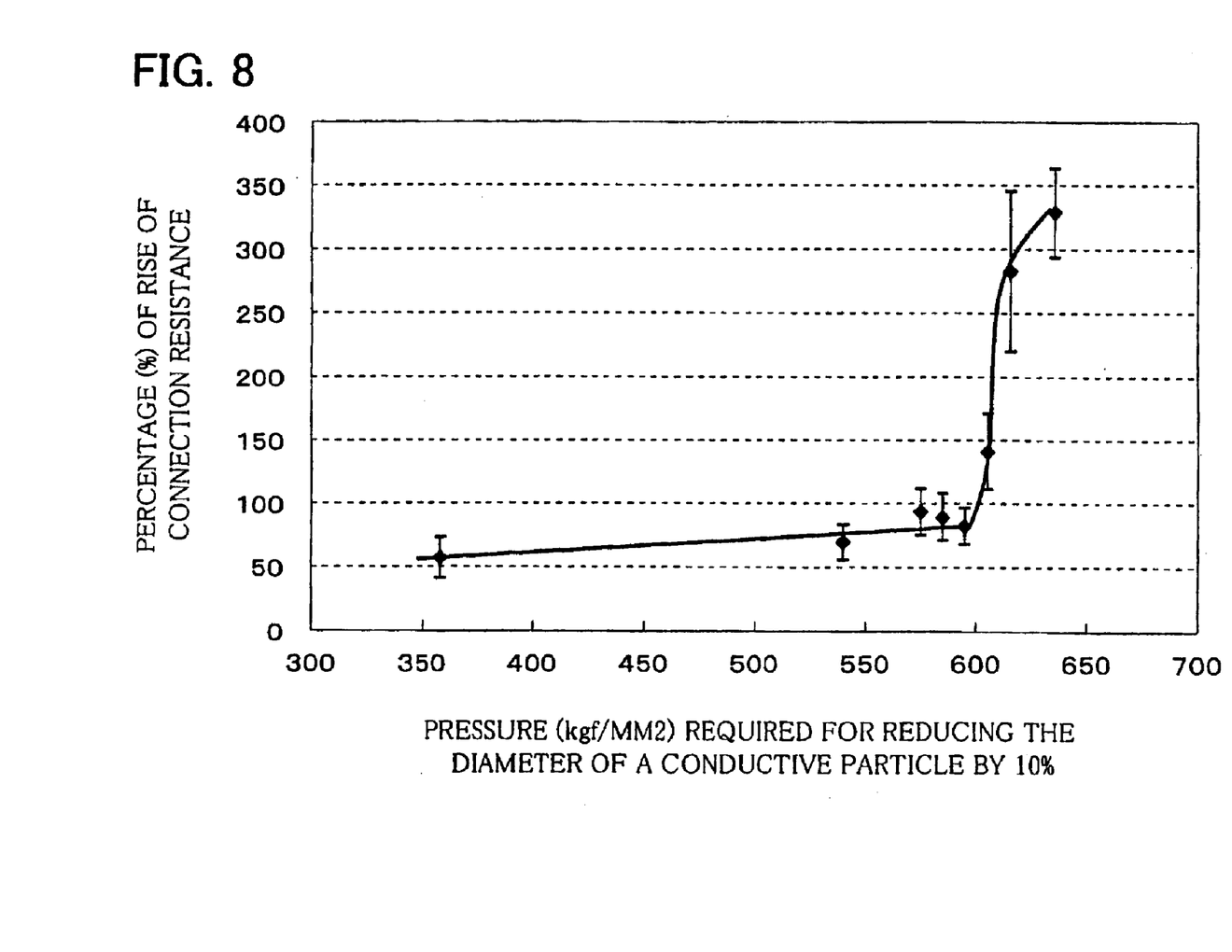
FIG. 8 is a graph showing variation of percentage (%) of rise of resistance, with respect to variation of pressure (kgf/mm$^2$) required for reducing the diameter of a conductive particle by 10%, in one embodiment of the present invention.

Further, the driving IC 4 and the glass substrate 8 were bonded by using each AC adhesive, and examined for percentage of rise with respect to their connection resistance (resistance between the bump electrode 9 and the pad 7) after a high-temperature and high-humidity test. FIG. 8 shows the result of the test in a state of a graph showing relation between each of the created AC adhesive (shown by 10% reduction pressure of the conductive particle) and connection resistance (percentage of rise of resistance). Further, FIG. 7 is a part of a graph shown in FIG. 8. As it is shown in those graphs, when the 10% reduction pressure is not more than 600 kgf/mm², the connection resistance can be reduced small enough for stability.

As described, the conductive particle 14 is preferably made of a particle whose 10% reduction pressure is in a range of 350 kgf/mm² to 600 kgf/mm². By thus using a conductive particle which can be deformed (shrunk) by relatively small pressure, even when the driving IC 4 and the liquid crystal panel 1 are bonded by the AC adhesive having the foregoing Young's modulus, it is possible to desirably deform the conductive particle 14 between the bump electrode of the driving IC 4 and the pad 7 of the liquid crystal panel 1. Further, the contact area between the conductive particles 14 and electrodes (bump electrodes and pads) can be enlarged, thereby reducing the connection resistance.

Note that, in case of adopting the conductive particle 14 whose 10% reduction pressure is of less than 350 kgf/mm², it may cause variation of particle diameter, or variation of particle hardness, and therefore the stable connection resistance cannot be obtained.

Further, in case of adopting the conductive particle 14 whose 10% reduction pressure is of more than 600 kgf/mm², the conductive particle 14 becomes hard, and which brings about an undesirable result of point contact of the conductive particles 14 and electrodes (bump electrodes and pads).

Further, the diameter of the conductive particle 14 is not particularly limited; however, it is preferably in a range of 2 μm to 3 μm. This is because, when the size of the conductive particle is too large, it causes contact/short-circuit between each particle of adjacent electrodes when the particles are caught between the electrodes. Further, when the size of the conductive particle is too small, the contact area with the electrodes will be reduced, thereby increasing the connection resistance. Accordingly, by determining the diameter of the conductive particles in the foregoing range, short-circuit between the electrodes can be prevented and an increase of the connection resistance can be suppressed.

Further, in the present embodiment, a glass substrate is used as the substrate in the liquid crystal panel. However, the substrate may be made of any materials having light transmittance property, such as a plastic.

Further, glass-transition temperature of the AC adhesive 13 after curing is not particularly limited; however, it is preferably in a range of 110° C. to 120° C. By having this range of glass-transition temperature, the contact area between the conductive particles 14 and the electrodes (bump electrodes and pads) can further be enlarged, thereby reducing the connection resistance.

The conductive particle 14 diffused in the AC adhesive 13 is not particularly limited but may be any kinds of conductive particle as long as the particle is capable of electrically connecting the bump electrode 9 formed on the driving IC 4 and the pad 7 formed on the glass substrate 8 of the liquid crystal panel 1.

Further, the manufacturing method of a liquid crystal display device of the present invention may be described as the following first to the third manufacturing methods. Namely, in the first manufacturing method of a liquid crystal display device, the device has a configuration such that: (a) a liquid crystal panel made of a pair of substrates holding a liquid crystal layer therebetween and (b) a liquid crystal driving IC are bonded through face down bonding; and the manufacturing method is performed in such a manner that: the conductive particles are provided between (a) a plurality of bonding bump electrodes on the liquid crystal driving IC and (b) bonding pads provided on a substrate of the liquid crystal panel to be opposite to the (a) a plurality of bonding bump electrodes, and then an insulative adhesive is applied around the driving IC and the liquid crystal panel so as to fix the IC and the panel.

In the foregoing method, the particle diameter of the conductive particle should be not more than 3 μm, the pressure (kgf/mm²) required for reducing the diameter of the conductive particle by 10% should be not more than 600 kgf/mm²; and also, the insulative adhesive should include a high molecular resin, a low molecular resin, a stress relaxation resin and a component for curing these resins by heat; and further, a Young's modulus of the insulative adhesive should be not more than 1.6 Gpa. By specifying these conditions, it is possible to prevent a bend of the glass substrate while maintaining reliable connection condition.

Further, the second manufacturing method is performed in the same manner as that of the first manufacturing method except for the setting of the glass-transition temperature of the insulative adhesive, which is adjusted to be not more than 120° C. With this condition, it is possible to prevent a bend of the glass substrate.

Further, the third manufacturing method of a liquid crystal display device, the device has a configuration such that: (a) a liquid crystal panel made of a pair of substrates holding a liquid crystal layer therebetween and (b) a liquid crystal driving IC are bonded through face down bonding, by using an anisotropic conductive adhesive made of an insulative adhesive mixed with conductive particles diffused therein; and the manufacturing method includes the steps of: applying the anisotropic conductive adhesive on the liquid crystal panel; mounting the liquid crystal driving IC on the liquid crystal panel by adjusting their positions; and curing the anisotropic conductive adhesive by performing thermo compression bonding with respect to the upper surface of the liquid crystal driving IC.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A manufacturing method of a liquid crystal display device, comprising the step of:

performing thermo compression bonding with respect to a driving integrated circuit and a glass substrate included in a liquid crystal panel so as to connect an electrode of the driving integrated circuit and an electrode of the glass substrate, by using an anisotropic conductive adhesive in which conductive particles are diffused in an insulative adhesive, wherein:

the anisotropic conductive adhesive includes a resin (a) whose average molecular weight is in a range of from 10000 to 100000, a resin (b) whose average molecular weight is not more than 1000, a stress relaxation resin, and a curing agent; and a Young's modulus of the anisotropic conductive adhesive after curing ranges of from 1.4 Gpa to 1.6 Gpa.

2. The manufacturing method of a liquid crystal display device as set forth in claim 1, wherein:

the resin (a) or the resin (b) is an epoxy resin.

3. The manufacturing method of a liquid crystal display device as set forth in claim 1, wherein:

the stress relaxation resin is made of particles of an acrylic resin or a silicone resin whose diameter is not more than 1 μm.

4. The manufacturing method of a liquid crystal display device as set forth in claim 1, wherein:

the conductive particle is a particle which requires pressure in a range of from 350 kgf/mm² to 600 kgf/mm² to reduce its diameter by 10%.

5. The manufacturing method of a liquid crystal display device as set forth in claim 1, wherein:

the anisotropic conductive adhesive has a glass-transition temperature in a range of from 110° C. to 120° C.

6. The manufacturing method of a liquid crystal display device as set forth in claim 1, wherein:

the conductive particle has a diameter in a range of from 2 μm to 3 μm.

7. A liquid crystal display device, comprising:

a driving integrated circuit provided with an electrode; and a liquid crystal panel including a glass substrate provided with an electrode, wherein:

the electrode of the driving integrated circuit is connected to the electrode of the glass substrate of the liquid crystal panel by performing thermo compression bonding with respect to the driving integrated circuit and the glass substrate, by using an anisotropic conductive adhesive including a resin (a) whose average molecular weight is in a range of from 10000 to 100000, a resin (b) whose average molecular weight is not more than 1000, a stress relaxation resin, and a curing agent; and a Young's modulus of the anisotropic conductive adhesive after curing ranges from 1.4 Gpa to 1.6 Gpa.

8. An anisotropic conductive adhesive, comprising:

conductive particles;

a resin (a) whose average molecular weight is in a range of from 10000 to 100000;

a resin (b) whose average molecular weight is not more than 1000;

a stress relaxation resin; and a curing agent, wherein:

a Young's modulus of the anisotropic conductive adhesive after curing ranges from 1.4 Gpa to 1.6 Gpa.

9. The anisotropic conductive adhesive as set forth in claim 8, wherein:

the anisotropic conductive adhesive has a glass transition temperature in a range of from 110° C. to 120° C.

10. The anisotropic conductive adhesive as set forth in claim 8, wherein:

the conductive particle is a particle which requires pressure in a range of from 350 kgf/mm² to 600 kgf/mm² to reduce its diameter by 10%.

11. The anisotropic conductive adhesive as set forth in claim 8, wherein:

the resin (a) or the resin (b) is an epoxy resin.

12. The anisotropic conductive adhesive as set forth in claim 8, wherein:

the stress relaxation resin is made of particles of an acrylic resin or a silicone resin whose diameter is not more than 1 μm.

13. A liquid crystal display device, comprising:

a driving integrated circuit; and a liquid crystal panel, wherein:

the driving integrated circuit is bonded to the liquid crystal panel by using an anisotropic conductive adhesive including a resin (a) whose average molecular weight is in a range of from 10000 to 100000, a resin (b) whose average molecular weight is not more than 1000, a stress relaxation resin, and a curing agent; and a Young's modulus of the anisotropic conductive adhesive after curing ranges from 1.4 Gpa to 1.6 Gpa.

* * * * *